United States Patent [15] 3,705,419

Bleher et al. [45] Dec. 5, 1972

[54] SILICON GATE FET-NIOBIUM OXIDE DIODE-MEMORY CELL

[72] Inventors: Johannes Hartmut Bleher, Nuertingen, Germany; Chi Shih Chang, Wappingers Falls, N.Y. 12590; Robert Charles Dockerty, Highland, N.Y. 12528

[73] Assignee: International Business Machines Corporation, Armonk, N.Y.

[22] Filed: Dec. 20, 1971

[21] Appl. No.: 209,621

[52] U.S. Cl. ...........317/235 R, 317/234 T, 317/234, 317/235 G

[51] Int. Cl. ..............................................H01l 19/00

[58] Field of Search...........317/234 V, 234 T, 235 G; 340/173.1 R

[56] References Cited

UNITED STATES PATENTS

| | | | |
|---|---|---|---|
| 3,387,286 | 6/1968 | Dennard | 317/235 |
| 3,408,543 | 10/1968 | Ono et al. | 317/235 |
| 3,673,471 | 6/1972 | Klein et al. | 317/235 |

*Primary Examiner*—Jerry D. Craig
*Attorney*—Robert J. Haase et al.

[57] ABSTRACT

A high density memory cell comprising a silicon gate field effect transistor and a bismuth-niobium oxide-niobium bistable switching diode integrally formed over the drain electrode of the FET. The memory cell is formed by providing an oxidized $P^-$ silicon wafer, stripping the oxide from the source, drain and gate region of the FET and regrowing the gate oxide. Polycrystalline silicon is deposited on the regrown gate oxide and the polysilicon is subtractively etched to delineate the gate electrode. Source and drain openings are etched using the remaining polysilicon as part of the etchant mask. An N+ diffusion is made to form the source and drain region and to dope the polycrystalline silicon FET gate electrode. The device is reoxidized and contact holes are opened to the source and drain region. Platinum-silicon is used to form the source and drain ohmic contacts. Niobium is deposited and subtractively etched except over the drain contact. Niobium oxide is formed by a wet anodizing step. Bismuth is deposited and subtractively etched except on the niobium oxide. Aluminum is deposited and subtractively etched to provide conducting pathways for contacting the source and the bismuth electrodes of the memory cell.

7 Claims, 4 Drawing Figures

INVENTORS
JOHANNES H. BLEHER
CHI S. CHANG
ROBERT C. DOCKERTY

BY Robert Haase
ATTORNEY

SILICON GATE FET-NIOBIUM OXIDE DIODE-MEMORY CELL

BACKGROUND OF THE INVENTION

Electrically alterable, non-volatile computer memory capability has been reported for niobium-niobium oxide-bismuth diodes. Such metal-oxide-metal (MOM) diodes have not yet reached their full potential with respect to stability during repetitive writing operations. However, they already are of significant interest in non-volatile, rewritable, read-only store memory applications. The MOM memory cell is an attractive answer to the demand for high density, low cost monolithic integrated circuit memory arrays but the realization of a mass producible MOM memory cell is strongly dependant upon the optimization of performance, structure and process considerations.

MOM devices are switched between two stable resistance states upon the application of respective polarities of switching voltages. The requirement for reversible current flow through the MOM device during writing operations necessitates that a bilaterally conducting switch be employed in series circuit with each MOM device when used in matrix memory configuration to avoid the well known "sneak path" problem. Another consideration is that it is always desirable to utilize a minimum number of process steps to form the necessary conduction pathways including cross-overs for supplying each MOM device and its associated switch with the necessary writing, reading and addressing signal currents. In this connection, it is advantageous to arrange that the higher currents which are required for writing be carried by conductors exhibiting low resistance. The lower currents required for addressing may be carried by conductors of somewhat greater resistance. Lastly, it is desired that a compact structure lending itself to high bit density memory designs be obtained with the aid of process steps well established in the art.

SUMMARY OF THE INVENTION

A high density memory cell comprising a field effect transistor and a metal-oxide-metal bistable switching diode. The field effect transistor is equipped with a silicon gate which functions as a mask during source and drain diffusion in the well known manner. The silicon gate also protects the underlying gate oxide from contamination during the formation of the MOM device on top of the FET drain. The MOM device comprises successive layers of niobium, niobium oxide and bismuth. Aluminum metallization lines are patterned along bit selection pathways and into contact with the FET source electrode and the MOM bismuth electrode. The metallization lines carry the relatively high currents required for establishing the two stable (high and low) resistance states of the MOM device, thus minimizing distribution losses in memory cell array configurations. The diffused silicon comprising the silicon gate is extended along word selection pathways for the distribution of the negligibly small currents to the FET gates.

High density is achieved through the use of the vertically oriented structure of the MOM device. Chip surface area is occupied only by the field effect transistors and the metallization and the diffused silicon distribution lines in the memory array. The selective use of the metallization lines in lieu of diffused conduction pathways on the memory array chip not only reduces distribution losses because of the higher conductivity of metallization relative to diffusions but also reduces objectionable capacitance between the distribution conductors and the substrate whereby smaller driving current are required and faster switching times are achieved.

DESCRIPTION OF THE PREFERRED EMBODIMENT

Figure 1:
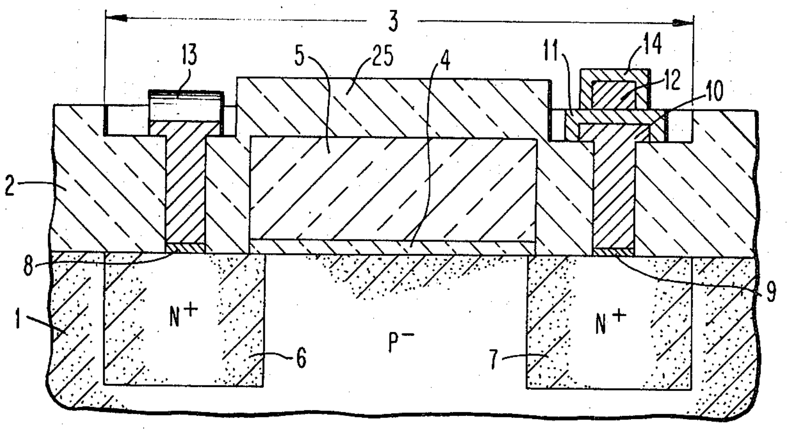
FIG. 1 is a simplified cross-sectional view of a preferred embodiment of a single memory cell of the present invention.

The memory cell of FIG. 1 comprises a silicon gate N channel, enhancement mode, insulated gate field effect transistor equipped with a niobium-niobium oxide-bismuth bistable switching diode (MOM) which is mounted directly on the drain electrode of the IGFET. The IGFET comprises a P-silicon substrate 1 which is oxidized to provide masking oxide 2. The oxide is stripped away from the source, drain and gate regions 3, a relatively thin gate dielectric such as silicon oxide 4 is formed over the regions 3 and polycrystalline silicon 5 is deposited over oxide 4. The polycrystalline silicon and the thin oxide are subtractively etched to delineate the gate electrode pattern and to form source and drain diffusion windows. N+ source and drain diffusions 6 and 7 are made in substrate 1 while the polycrystalline silicon 5 is simultaneously rendered conductive by the diffusion treatment. After a reoxidation, contact holes are opened to the source and drain regions and platinum is alloyed with the silicon to provide source and drain contacts 8 and 9. Those skilled in the art will recognize the process briefly outlined above to be a conventional contemporary process for the formation of a self-aligned silicon gate field effect transistor.

Bistable switching diodes comprising successive layers of niobium, niobium oxide and bismuth are well known in the prior art. For example, some early work using MOM diodes is described in the paper "Electrode Effects and Bistable Switching of Amphorous $Nb_2O_5$ Diodes" by T. W. Hickmott et al, Solid State Electronics, 1970, Volume 13, pages 1033–1047. Briefly, the diodes exhibit electrically reversible bistable resistance values when subjected to certain breakdown treatments. The majority of MOM bistable switching diodes including the niobium oxide-bismuth diode of the preferred embodiment of the present invention are fabricated in a low-conductivity state. After fabrication, the diodes are subjected to a breakdown treatment to develop a high conductivity state. Thereafter, the diodes may be switched between a stable high resistance state and a stable low resistance state by the application of switching potentials of respective polarities. Both impedance states are non-volatile in the sense that they are preserved in the absence of any applied potentials for useful periods of time. Although some early development results tended to show that the diodes were vulnerable when placed in applications requiring frequent writing, the stability of MOM devices under repeated read operations makes them particularly suitable for use in electrically alterable read only memories.

Referring again to FIG. 1, the MOM device of the preferred embodiment of the present invention comprises niobium 10 which is deposited on platinum-silicide drain contact 9 and then wet anodized to form niobium oxide 11 and covered by bismuth diode electrode 12. Finally, aluminum is deposited and subtractively etched to form source contact 13, diode electrode contact 14 and the signal conduction pathways of the memory array as shown in FIG. 2A.

Figure 2A:
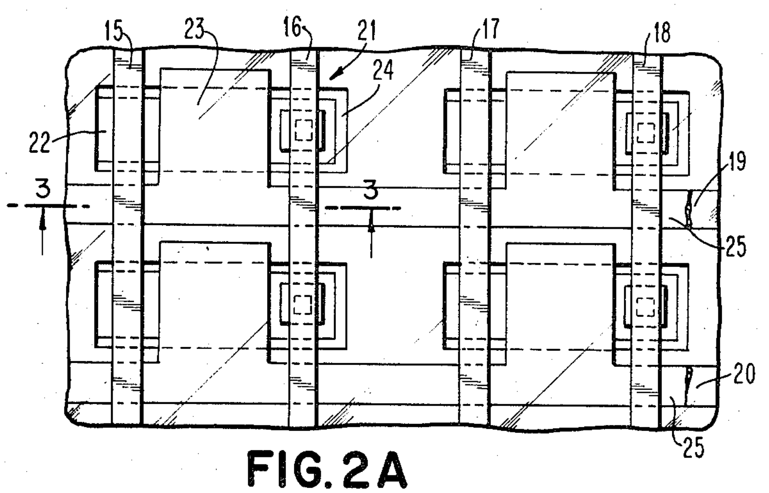
FIG. 2A is a simplified plan view of a portion of a memory cell array using a plurality of the devices of FIG. 1.

It will be noted that the aluminum conduction pathways 15–18 of FIG. 2A are arranged along the Y coordinate axis of the memory array whereas the doped polysilicon gate distribution conductors 19 and 20 are arranged along the X coordinate axis of the memory array. The word address signal for writing or reading is applied to conductors 19 and 20, as desired, whereas the bit writing signals are applied to conductor pairs 15 and 16 or 17 and 18 with appropriate polarity, depending upon which binary state a given memory cell is to be placed into. For example, if bit memory cell 21 comprising source 22, gate 23, drain 24 and the MOM device thereon is to be placed into a first binary state, polysilicon 19 and conductor 15 are made positive with respect to conductor 16 by an amount sufficient to place the MOM device into the desired binary state. Correspondingly, the addressed memory cell 21 receives a writing potential of opposite polarity on conductors 15 and 16 and of sufficient amplitude to place the MOM device into the opposite binary state. Sensing is accomplished by applying potentials to conductors 15 and 16 and to conductor 19 of sufficient amplitudes to render memory cell 23 conductive and draw substantial current if the MOM device associated therewith is in the low resistance condition. Substantially no current flows through the memory cell if the respective MOM device is in the high resistance condition under the same addressing conditions. Thus, the presence or absence of current in conductors 15 and 16 evidence the binary state of the addressed memory cell 21 in the example considered.

Figure 2B:
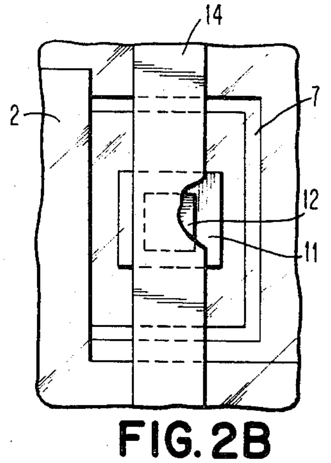
FIG. 2B is a simplified plan view of the drain contact area of the device of FIGS. 1 and 2.

The drain region typical of the memory cell of FIG. 2A is shown in the enlarged drawing of FIG. 2B. The niobium, niobium oxide, bismuth and aluminum regions are designated by the same reference numerals as in the cross sectional view of FIG. 1. It will be observed that the surface area occupied by the MOM device lies within the boundaries of the drain diffusion 7 and does not require any additional allocation of chip area beyond that which is required for the FET per se. In effect, the individual memory cell comprising the memory array occupies no more than the area required by a single FET whereby high bit density is achieved on the memory array chip.

Figure 3:
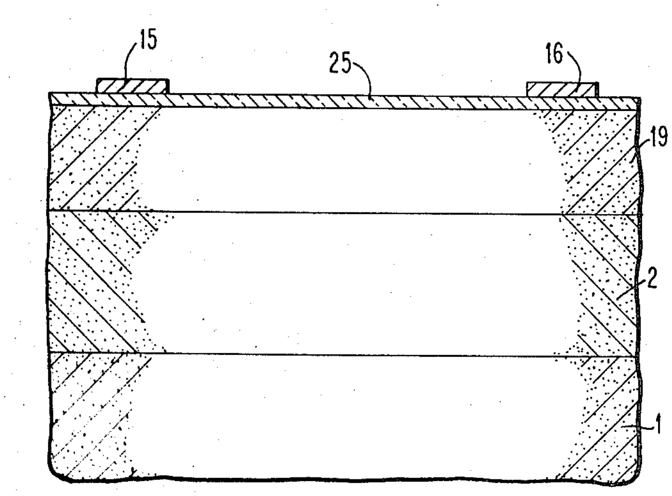
FIG. 3 is a simplified cross-sectional view of the array of FIG. 2A in a non-device area.

FIG. 3 shows the successive layers comprising the memory array chip as seen in a cross section taken between the active memory cell word lines on the chip. An important feature of the present invention is that the relatively high currents required for switching the niobium-niobium oxide-bismuth diodes between their resistance states are carried by single level metallurgy lines 15 and 16 which are insulated by oxide 25 from the doped polycrystalline silicon 19. Polycrystalline silicon 19 carries only the FET gate addressing signals which do not require high conductivity distribution pathways. Oxide layer 25 is produced during the reoxidation step following the source and drain diffusion described in connection with FIG. 1.

While this invention has been particularly described with reference to the preferred embodiments thereof, it will be understood by those skilled in the art that the foregoing and other changes in form and details may be made therein without departing from the spirit and scope of the invention.

What is claimed is:

1. A memory cell comprising:

a semiconductor substrate of a first conductivity type, two regions of opposite conductivity type in said substrate, an electrical insulating layer over said substrate extending between said regions, a layer of silicon on and coterminous with said insulating layer, said layer of silicon containing a conductivity determining impurity of a concentration sufficient to render conductive said layer of silicon, a first electrode contact on one of said regions, a metal-oxide-metal bistable switching diode formed on the other of said regions: said diode comprising a first layer of niobium, a second layer of niobium oxide on said first layer, and a third layer of bismuth on said second layer, said diode occupying a surface area of said semiconductor substrate circumscribed by the surface area occupied by said other region; and a second electrode contact on said third layer.

2. The memory cell defined in claim 1 wherein said concentration is substantially equal to the impurity concentration of said regions.

3. A memory cell array comprising a plurality of memory cells as defined in claim 1, said memory cells being arranged along matrix X and Y coordinates and further including a first conductor means for electrically interconnecting said first contacts of the memory cells along a given matrix Y coordinate, a second conductor means for electrically interconnecting said second contacts of the memory cells along a given matrix Y coordinate, and an impurity-containing silicon member interconnecting said layers of silicon of the memory cells along a given matrix X coordinate, said silicon member having an impurity concentration sufficient to render conductive said silicon member.

4. The memory cell array defined in claim 3 wherein said impurity concentrations of said layer of silicon and of said silicon member are substantially equal to the impurity concentrations of said regions.

5. The memory cell array defined in claim 3 and further including a source of bit writing signals coupled to said first and second conductors and a word address signal source coupled to said silicon member.

6. The memory cell array defined in claim 3 wherein said layer of insulating material is silicon dioxide, said silicon layer is polycrystalline silicon and said first and second conductors comprise aluminum.

7. The memory cell array defined in claim 3 wherein said conductors and said silicon member are insulated from each other by silicon dioxide.

* * * * *